United States Patent
Ante et al.

(10) Patent No.: US 9,919,912 B2
(45) Date of Patent: Mar. 20, 2018

(54) MICROELECTRONIC COMPONENT ARRANGEMENT AND PRODUCTION METHOD FOR A MICROELECTRONIC COMPONENT ARRANGEMENT

(71) Applicant: Robert Bosch GmbH, Stuttgart (DE)

(72) Inventors: Frederik Ante, Stuttgart (DE); Maximilian Amberger, Karlsruhe (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 15/273,772

(22) Filed: Sep. 23, 2016

(65) Prior Publication Data
US 2017/0088412 A1 Mar. 30, 2017

(30) Foreign Application Priority Data

Sep. 24, 2015 (DE) .......................... 10 2015 218 355

(51) Int. Cl.
*B64C 1/22* (2006.01)
*B81B 3/00* (2006.01)
*B81C 1/00* (2006.01)

(52) U.S. Cl.
CPC ........ *B81B 3/0054* (2013.01); *B81C 1/00333* (2013.01); *B81B 2201/0264* (2013.01); *B81B 2207/098* (2013.01); *B81C 2201/0167* (2013.01); *B81C 2201/053* (2013.01); *H01L 2224/27013* (2013.01)

(58) Field of Classification Search
CPC .......... B81B 3/0054; B81B 2201/0264; B81B 2207/098; B81C 1/00333; B81C 2201/053
See application file for complete search history.

(56) References Cited

U.S. PATENT DOCUMENTS

| | | | | |
|---|---|---|---|---|
| 6,140,144 A | * | 10/2000 | Najafi | ................. B81C 1/00269 |
| | | | | 438/106 |
| 6,521,481 B1 | | 2/2003 | Chen et al. | |
| 7,359,579 B1 | * | 4/2008 | Paek | ................. H01L 27/14618 |
| | | | | 257/E31.117 |
| 2006/0148136 A1 | | 7/2006 | Odegard et al. | |
| 2008/0315410 A1 | | 12/2008 | Johnson | |
| 2011/0084388 A1 | | 4/2011 | Gokhale et al. | |

(Continued)

FOREIGN PATENT DOCUMENTS

| | | |
|---|---|---|
| DE | 10 2004 008 148 A1 | 9/2004 |
| DE | 10 2005 038 752 A1 | 2/2007 |

(Continued)

*Primary Examiner* — Dung Le
(74) *Attorney, Agent, or Firm* — Maginot, Moore & Beck LLP

(57) ABSTRACT

A microelectronic component arrangement includes a sensor and a carrier. The sensor has a detection surface and a region including contact elements situated at a first distance with respect to one another. The carrier includes a mounting surface, and the sensor is fixed on the carrier by the contact elements situated at a first distance with respect to one another at least regionally. The detection surface is opposite the mounting surface in a manner having a second distance with respect to the mounting surface. The contact elements are wetted by a mechanically stabilizing material, the region including the contact elements is enclosed by the mechanically stabilizing material, and the detection surface is free of the mechanically stabilizing material.

16 Claims, 6 Drawing Sheets

(56) References Cited

U.S. PATENT DOCUMENTS

2012/0267731 A1* 10/2012 Graf ................ G01L 19/148
 257/415
2016/0207762 A1* 7/2016 Lu ................ B81C 1/00309

FOREIGN PATENT DOCUMENTS

DE 10 2006 010 511 A1 9/2007
DE 10 2014 208 100 A1 10/2015

\* cited by examiner

MICROELECTRONIC COMPONENT ARRANGEMENT AND PRODUCTION METHOD FOR A MICROELECTRONIC COMPONENT ARRANGEMENT

This application claims priority under 35 U.S.C. § 119 to patent application number DE 10 2015 218 355.6, filed on 24 Sep. 2015 in Germany, the disclosure of which is incorporated herein by reference in its entirety.

BACKGROUND

The present disclosure relates to a microelectronic component arrangement and a production method for a corresponding microelectronic component arrangement.

Microelectronic components may be applied as flip-chip, for example. That means that a sensor—for example MEMS—is equipped with solder balls and then soldered face-down onto a further substrate. After soldering onto the substrate, a further chip or a printed circuit board, the construction requires a so-called underfill in order that the different coefficients of thermal expansion of sensor and substrate do not destroy the construction, and in order to increase the stability of the solder connections.

With advancing miniaturization of the microelectronic component arrangements, it is necessary to introduce and/or arrange the underfill between sensor and carrier in a controlled manner, such that a media access or gas-sensitive layers of the sensor are not covered and/or closed by the underfill. The controlled introduction of the underfill into regions provided for it between sensor and carrier constitutes a technical challenge, in particular.

DE 10 2005 038 752 A1 describes a method for applying semiconductor chips.

DE 10 2006 010 511 A1 describes a semiconductor arrangement.

U.S. 2008 315 410 A1 describes a microelectronic substrate and a microelectronic package.

U.S. 2006 148 136 A1 describes a structuring plasma method.

U.S. 2011 084 388 A1 describes an electronic device and a method for producing the electronic device.

SUMMARY

The present disclosure provides a microelectronic component arrangement and a corresponding production method for a microelectronic component arrangement having the features described herein.

The following description further discloses preferred developments.

The present disclosure makes it possible to introduce a mechanically stabilizing material—also called underfill or underfill material—into predetermined regions between the sensor and the carrier by means of capillary forces, wherein in particular the detection surface of the sensor remains free of the mechanically stabilizing material and the functionality of the sensor, for example of a gas-sensitive detection surface, can be ensured.

This is achieved by means of a microelectronic component arrangement comprising a sensor, wherein the sensor has at least one detection surface and at least one region comprising contact elements situated at a first distance with respect to one another. Furthermore, the microelectronic component arrangement comprises a carrier comprising a mounting surface. The sensor is fixed on the carrier by means of the contact elements situated at a first distance with respect to one another at least regionally, and the detection surface is opposite the mounting surface in a manner having a second distance with respect to the mounting surface. In this case, the contact elements are wetted by a mechanically stabilizing material, and the at least one region is enclosed by the mechanically stabilizing material, and the detection surface is free of the mechanically stabilizing material.

The mechanically stabilizing material, called underfill hereinafter, may comprise an elastic and/or thermally stable plastic depending on the use of the microelectronic component arrangement. The underfill is applied after soldering for example by dispensing or jetting alongside the sensor, wherein the capillary forces draw the underfill into the regions of the contact elements situated at a first distance with respect to one another. In other words, this prevents the underfill from completely filling a gap between the sensor and the carrier and prevents the detection surface from no longer being accessible from outside. Furthermore, no additional structures that curb or slow down a flowing of the underfill are necessary on the sensor or the carrier. This leads to a significant saving of material and time, such that in particular the costs are reduced compared with conventional solutions.

Although the production method for a microelectronic component arrangement as described here is described on the basis of a sensor and a carrier, it goes without saying that the production method described here is also applicable for producing microelectronic component arrangements comprising a multiplicity of sensors arranged on a carrier.

In accordance with one preferred development, at least one access to the detection surface is present between the detection surface and the mounting surface, wherein the access is free of the mechanically stabilizing material owing to the capillary forces. It is thus possible to provide a media access that is simple to produce.

In accordance with a further preferred development, the first distance between the contact elements has a value which is less than or equal to the second distance between the detection surface and the mounting surface. It is thus possible to bring about particularly efficiently a surface tension of the underfill itself and an interfacial tension between the underfill and the contact elements.

In accordance with a further preferred development, the value of the first distance is between 10 micrometers and 30 micrometers and the value of the second distance is between 30 micrometers and 100 micrometers. In the case of these values it was established, in particular, that the capillary forces can be manifested particularly well, such that the detection surface and/or the access are/is not covered by the underfill.

In accordance with a further preferred development, a third distance spaces apart from one another at least two regions comprising the contact elements, wherein the third distance has a value of at least 100 micrometers. In other words, the access has a width, wherein the width of the access may comprise a value of 100 micrometers. In this case, the third distance runs transversely, in particular perpendicularly, with respect to the second distance of the microelectronic component arrangement. In this regard, a coalescence of the underfill between the regions comprising the contact elements can additionally be prevented in a simple manner.

In accordance with a further preferred development, a ratio between the second distance and the first distance is greater than two, a ratio between the third distance and the second distance is greater than one, and a ratio between the third distance and the first distance is greater than three. In other words, it is possible, particularly in the case of the aspect ratios mentioned here, to achieve a self-assembly of the underfill between substrate and carrier and also between the contact elements.

In accordance with a further preferred development, the contact elements (K1) comprise solder balls, solder bumps and/or solder pillars. It is thus possible to use a multiplicity of construction and connection techniques for providing the microelectronic component arrangement. The contact elements may comprise gold, copper or a suitable solder material. In addition, a functionalization of the metallic contact elements may advantageously be effected by structuring in order to increase the wettability of the contact elements with the underfill material, a selectivity of the capillary flow increasing.

In accordance with a further preferred development, the mechanically stabilizing material comprises an underfill material. By way of example, the underfill material comprises a mixture of epoxy resin with different fillers. The filler may comprise silicon dioxide, in particular.

In accordance with a further preferred development, the sensor comprises a circuit. By way of example, the sensor may comprise a MEMS. It is thus possible to provide microelectronic component arrangements of particularly small design.

In accordance with a preferred development, further solder balls are formed at least regionally on a side of the carrier facing away from the mounting surface. It is thus possible to connect the microelectronic component arrangement to an evaluation circuit in a simple manner by means of the further solder balls.

In accordance with a preferred development, the electrical connection is effected by means of solder balls and a mechanically stabilizing material. By way of example, the mechanically stabilizing material can be understood to mean an underfill material. In particular, the underfill material serves for providing a stable electrical connection taking account of the different coefficients of thermal expansion of the sensor and the carrier. The carrier may comprise a printed circuit board, in particular.

The features described here for the production method for the microelectronic component arrangement are correspondingly also applicable to the microelectronic component arrangement, and vice versa.

BRIEF DESCRIPTION OF THE DRAWINGS

Further features and advantages of the present disclosure are explained below on the basis of embodiments with reference to the figures.

In the figures.

DETAILED DESCRIPTION

In the figures, identical reference signs designate identical or functionally identical elements.

Figure 1A:
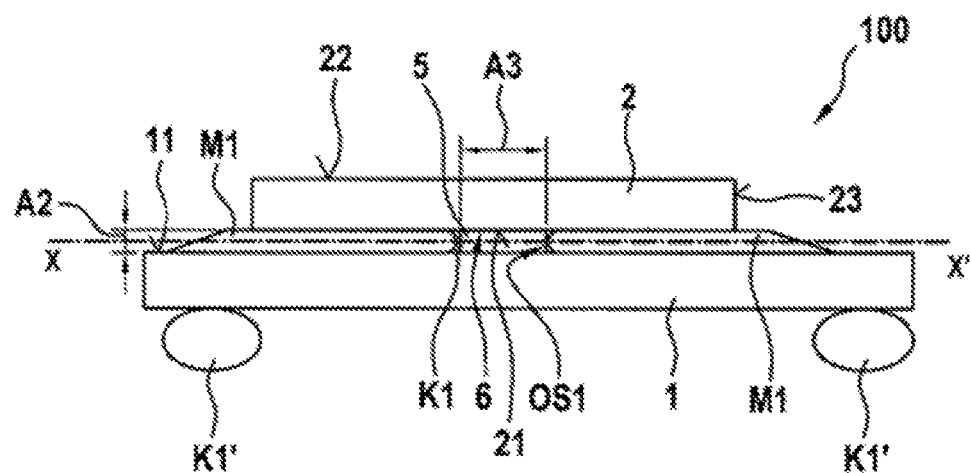
FIGS. 1a), b) show a schematic perpendicular view for elucidating a microelectronic component arrangement and a plan view of the microelectronic component arrangement in accordance with a first embodiment of the present disclosure.
Figure 1B:
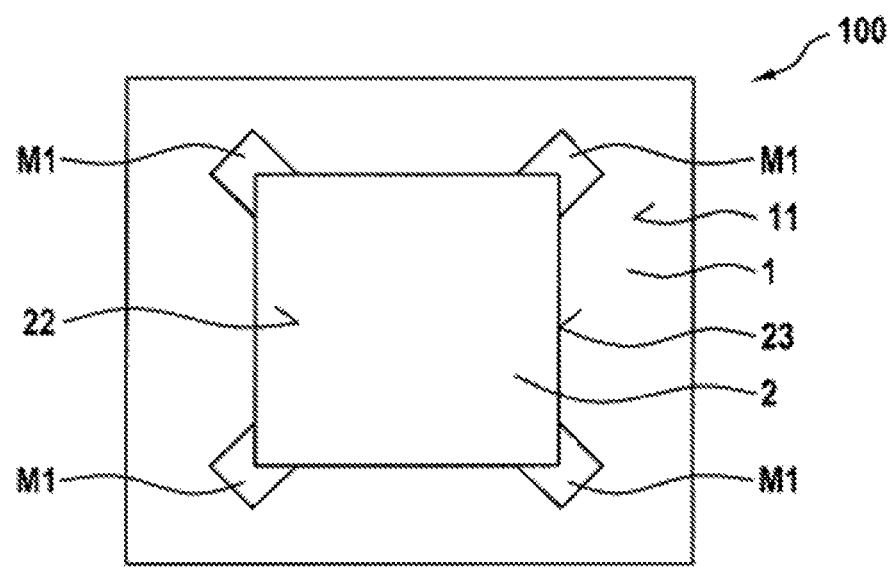

FIGS. 1a and 1b show a schematic perpendicular view for elucidating a microelectronic component arrangement and a plan view of the microelectronic component arrangement in accordance with a first embodiment of the present disclosure.

In FIG. 1a, the reference sign 100 denotes a microelectronic component arrangement comprising a sensor 2, wherein the sensor 2 has a detection surface 6. Furthermore, FIG. 1a shows a carrier 1 comprising a mounting surface 11, wherein the sensor 2 is mounted on the carrier 1 by means of a construction and connection device in such a way that the detection surface 6 is opposite the mounting surface 11 in a manner having a second distance A2 and an access 5 to the detection surface 6 is present between the detection surface 6 and the mounting surface 11, wherein the access 5 is free of a mechanically stabilizing material M1 at least regionally.

In FIG. 1a, further solder balls K1' are formed on a side facing away from the mounting surface 11. Said further solder balls can be used for example for further connection of the microelectronic component arrangement 100 to an ASIC.

FIG. 1b shows the plan view of the microelectronic component arrangement in accordance with the first embodiment of the present disclosure.

FIG. 1b shows a view of a second surface 22 of the microelectronic component arrangement 100 and the mounting surface 11. The mechanically stabilizing material M1 projects at corresponding locations of the sensor 2 via side surfaces 23 and thus enlarges corresponding areas for compensating for the different coefficients of thermal expansion of the sensor 2 and the carrier 1.

The schematic views shown in the following FIGS. 2 to 7 correspond to a section along the dashed line X-X' in FIG. 1a.

Figure 2A:
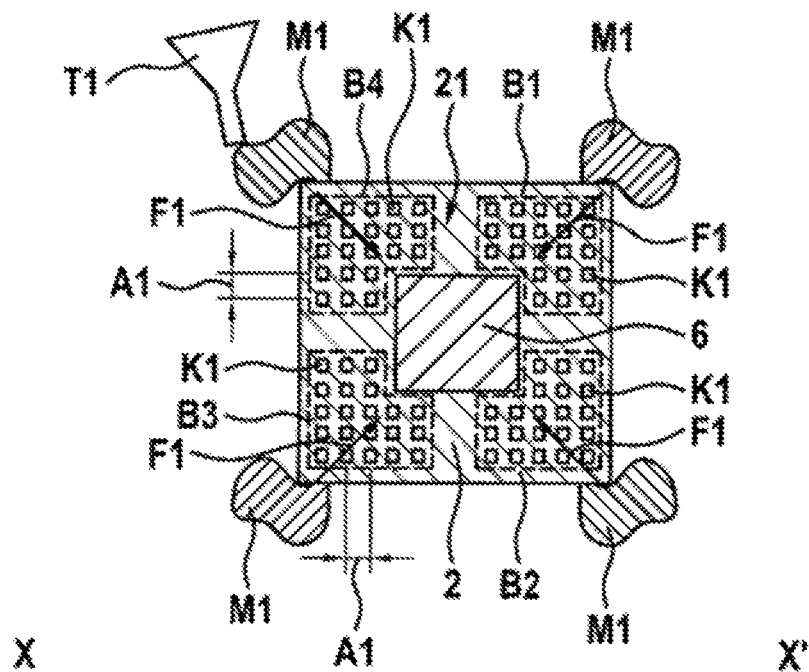
FIGS. 2a)-c) show schematic views of a first surface of the microelectronic component arrangement for elucidating a corresponding production method in accordance with the first embodiment of the present disclosure.
Figure 2B:
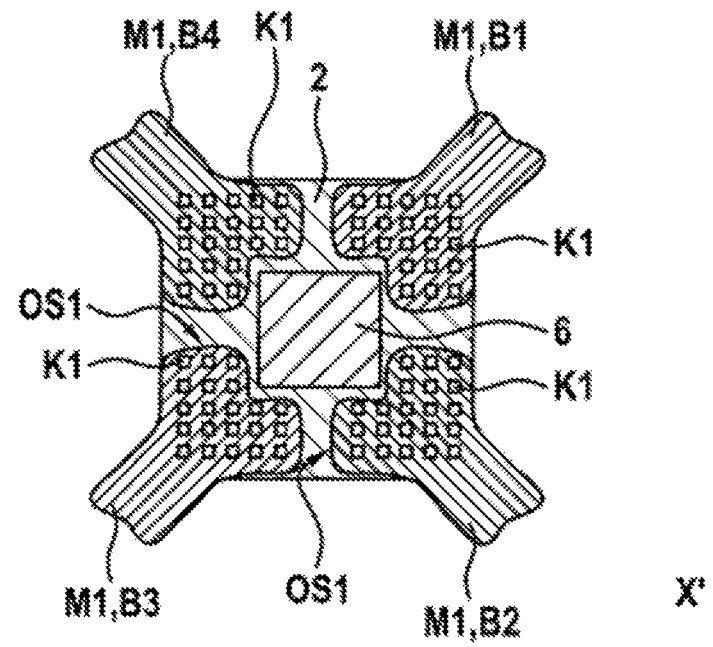
Figure 2C:
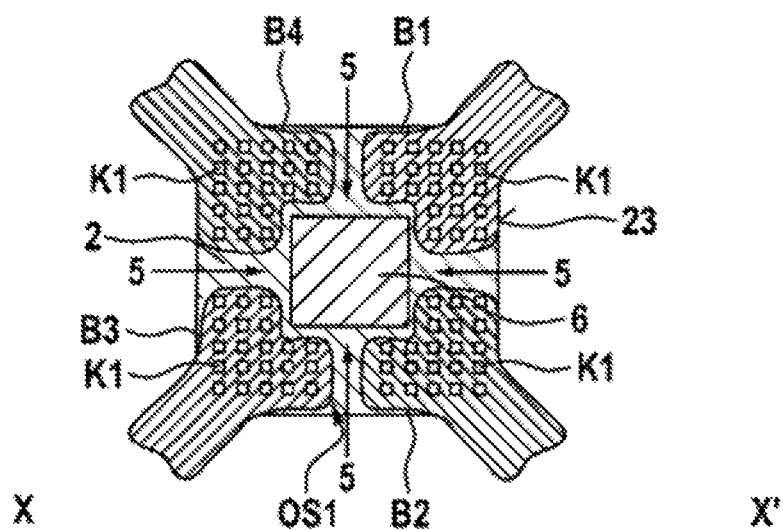

FIGS. 2a to 2c are schematic views of a first surface of the microelectronic component arrangement for elucidating a corresponding production method in accordance with the first embodiment of the present disclosure.

FIGS. 2a to 2c show the first surface 21 of the sensor 2, wherein the sensor 2 has the detection surface 6, four accesses 5, and regions B1, B2, B3, B4 comprising contact elements K1 situated at a first distance A1 with respect to one another. The regions B1, B2, B3, B4 are illustrated in a manner enclosed by dashed lines in FIG. 2a. In FIG. 2a, reference sign T1 denotes a device that can be used for applying, for example dispensing or jetting, the mechanically stabilizing material M1. The regions B1, B2, B3, B4 are formed in each case in a corner region of the quadrilateral sensor 2. The first distance A1 is present between each of the contact elements K1. The distance A1 is so small that the mechanically stabilizing material M1 flows between the contact elements K1 as a result of capillary forces F1, wherein the contact elements are wetted by the mechanically stabilizing material and the four regions B1, B2, B3, B4 are enclosed by the mechanically stabilizing material M1 (see FIG. 2b). In other words, the detection surface 6 and the four accesses 5 are free of the mechanically stabilizing material M1. The access 5 can be understood as a media access.

FIG. 2c shows that the mechanically stabilizing material M1 is kept between the contact elements K1 by a surface tension OS1 that forms. The detection surface 6 is thus freely accessible for a medium from outside via the accesses 5 from all four side surfaces 23.

The value of the first distance A1 may be between 10 micrometers and 30 micrometers, and the value of the second distance A2 may be between 30 micrometers and 100 micrometers.

Figure 3:
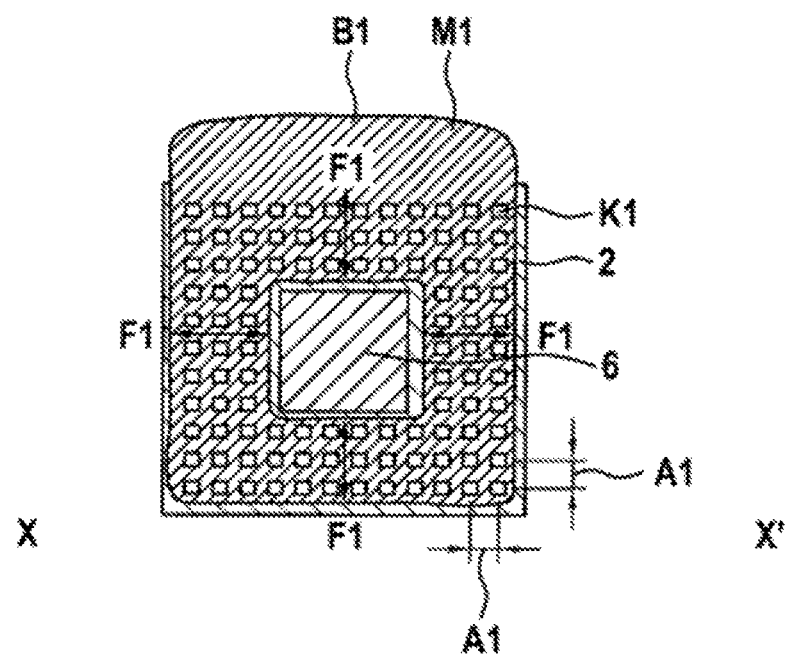
FIG. 3 shows a schematic view of a first surface of a microelectronic component arrangement in accordance with a second embodiment of the present disclosure.

FIG. 3 is a schematic view of a first surface of a microelectronic component arrangement in accordance with a second embodiment of the present disclosure.

FIG. 3 is based on FIG. 2c with the difference that no accesses are formed in FIG. 3. Consequently, a region B1 enclosing the detection surface 6 is formed in FIG. 3. This may also involve a hermetic sealing which can be applied particularly in pressure sensors.

Figure 4:
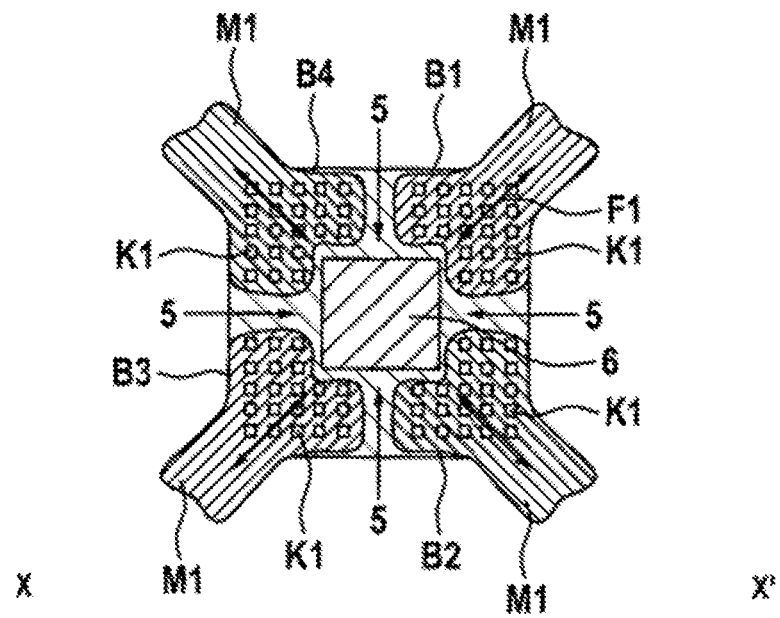
FIG. 4 shows a further enlarged schematic view of the first surface of the microelectronic component arrangement in accordance with the first embodiment of the present disclosure.

FIG. 4 is a further enlarged schematic view of the first surface of the microelectronic component arrangement in accordance with the first embodiment of the present disclosure.

FIG. 4 is based on FIG. 2c and illustrates once again, by means of the double-headed arrow F1 illustrated in the regions B1, B2, B3, B4 that the capillary forces firstly draw the mechanically stabilizing material M1 between the contact elements K1 from outside and also keep the mechanically stabilizing material M1 in the regions B1, B2, B3, B4 as a result of the surface tension OE1 between the contact elements K1, such that the accesses 5 and also the detection surface 6 are free of the mechanically stabilizing material M1.

Figure 5:
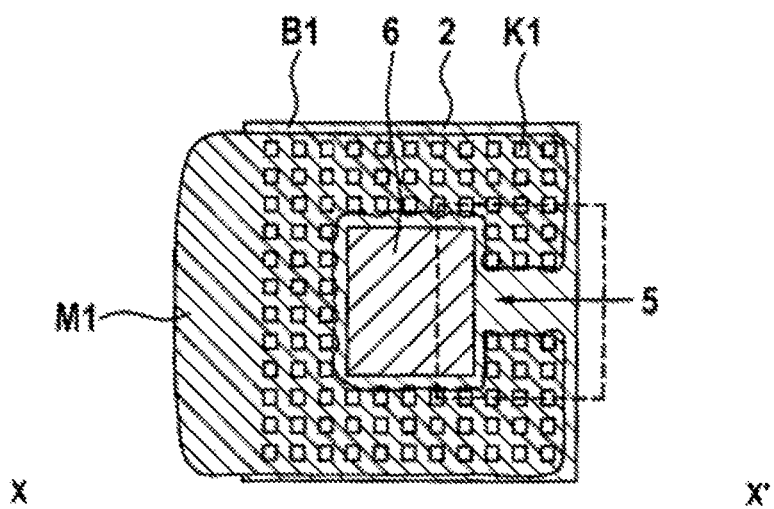
FIG. 5 shows a schematic view of a first surface of the microelectronic component arrangement in accordance with a third embodiment of the present disclosure.

FIG. 5 is a schematic view of a first surface of the microelectronic component arrangement in accordance with a third embodiment of the present disclosure.

FIG. 5 is based on FIG. 3 with the difference that an access 5 to the detection surface 6 is formed in FIG. 5. In this case, the access 5 is formed on a side opposite an intake region of the mechanically stabilizing material M1. This can be realized by corresponding arrangement of the contact elements K1 on the first surface 21 of the sensor 2. The intake region has an uninterrupted arrangement of the contact elements K1, whereas on the side with the access 5 the contact elements K1 correspondingly have a gap or an interruption in their arrangement.

Figure 6:
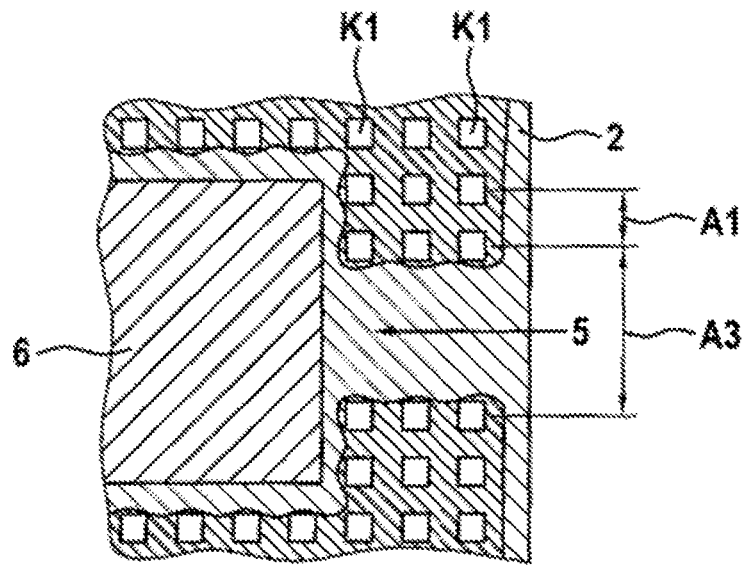
FIG. 6 shows an enlarged schematic view of the first surface of the microelectronic component arrangement in accordance with the third embodiment of the present disclosure.

The dashed box in FIG. 5 represents a region shown in an enlarged view in FIG. 6.

FIG. 6 is an enlarged schematic view of the first surface of the microelectronic component arrangement in accordance with the third embodiment of the present disclosure.

FIG. 6 shows the enlarged region on the basis of FIG. 5 for clarifying the size ratios between the first distance A1 and the third distance A3. A ratio between the third distance A3 and the first distance A1 which is greater than 3 is preferred in this case.

Figure 7:
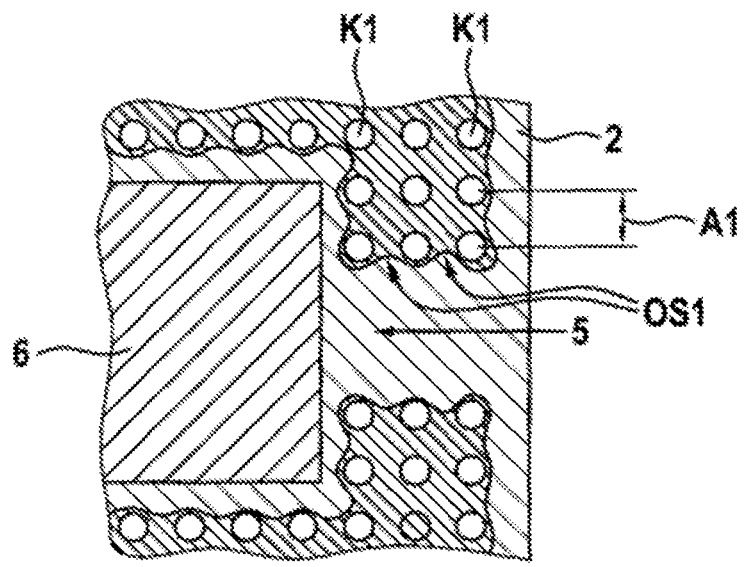
FIG. 7 shows a further enlarged schematic view of the first surface of the microelectronic component arrangement in accordance with the third embodiment of the present disclosure.

FIG. 7 is a further enlarged schematic view of the first surface of the microelectronic component arrangement in accordance with the third embodiment of the present disclosure.

FIG. 7 is based on FIG. 6 with the difference that the contact elements K1 have a round cross-sectional shape instead of a quadrilateral cross-sectional shape. FIG. 7 clarifies that the capillary forces F1 and surface tensions OE1 described here depend primarily on the first distance A1 and the geometrical shape of the contact elements K1 is scarcely of importance. Consequently, the disclosure can be used in a multiplicity of construction and connection techniques.

Figure 8:
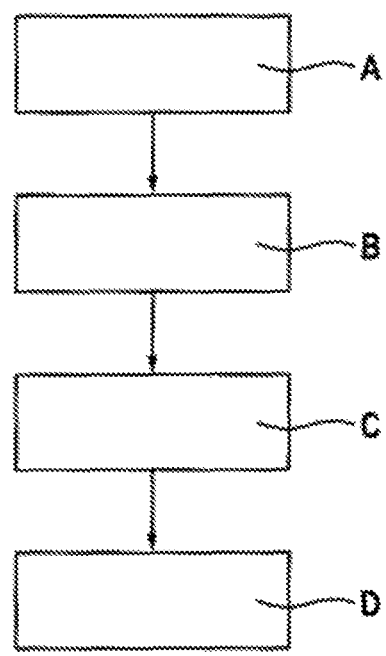
FIG. 8 shows a flow diagram for elucidating a sequence of a production method for a microelectronic component arrangement.

FIG. 8 is a flow diagram for elucidating a sequence of a production method for a microelectronic component arrangement.

In this respect, a step A involves providing the sensor 2 having the surface 21 and the second surface 22 opposite the first surface 21, and also the at least one side surface 23, wherein the first surface 21 comprises the at least one detection surface 6 and the at least one region B1, B2, B3, B4 comprising contact elements (K1) having the first distance (A1) with respect to one another (see also FIGS. 2a to 2c). The detection surface 6 may for example have a quadrilateral shape and be arranged centrally on the first surface 21. The detection surface 6 may be provided in particular for detecting pressure, moisture and/or gases and be part of a measuring element of the sensor 2. In other words, the sensor 2 described here may be a media sensor.

A next step B of the production method involves providing the carrier 1 comprising the mounting surface 11. The carrier 1 may comprise a printed circuit board, in particular.

A subsequent method step C involves in particular electrically connecting the sensor 2 to the mounting surface 11 by means of the at least one region B1, B2, B3, B4, wherein the second distance A2 is set between the at least one detection surface 6 and the mounting surface 11.

In method step D, the connection provided in step C is stabilized by the mechanically stabilizing material M1, wherein the contact elements K1 are wetted with the mechanically stabilizing material M1 by capillary forces, and the at least one region B1, B2, B3, B4 comprising the contact elements K1 is enclosed by the mechanically stabilizing material M1, and the detection surface 6 is kept free of the mechanically stabilizing material M1 by the capillary forces F1.

Furthermore, steps A to D proceed in the order as shown in FIG. 8.

Although the present disclosure has been described on the basis of preferred exemplary embodiments, it is not restricted thereto. In particular, the materials and constructions mentioned are by way of example and are not restricted to the examples explained.

The disclosure can be used in particular in the case of MEMS sensors in the automotive or consumer sector which are integrated by flip-chip in the housing. By way of example, the microelectronic component arrangement described here can be used for stress-sensitive pressure sensors.

What is claimed is:

1. A microelectronic component arrangement comprising:
   a carrier including a mounting surface; and
   a sensor, including:
      at least one detection surface;
      a plurality of contact elements that (i) are distributed over a first region of the sensor and over at least one further region of the sensor such that adjacent contact elements within each region are spaced apart from each other by a first distance, and (ii) at least regionally fix the sensor on the carrier such that the at least one detection surface is opposite the mounting surface at a second distance, wherein
the first distance is less than or equal to the second distance;
the first distance is between 10 micrometers and 30 micrometers; and
the second distance is between 30 micrometers and 100 micrometers; and
a mechanically stabilizing material that encloses the first region and the at least one further region such that the plurality of contacts are wetted by the mechanically stabilizing material, and such that the at least one detection surface is free of the mechanically stabilizing material.

2. The microelectronic component arrangement as claimed in claim 1, wherein:
at least one access to the detection surface is present between the at least one detection surface and the mounting surface, and
the at least one access is free of the mechanically stabilizing material.

3. The microelectronic component arrangement as claimed in claim 1, wherein:
adjacent regions of the sensor are spaced apart from each other by a third distance; and
the third distance is at least 100 micrometers.

4. The microelectronic component arrangement as claimed in claim 3, wherein:
a ratio between the second distance and the first distance is greater than two,
a ratio between the third distance and the second distance is greater than one, and
a ratio between the third distance and the first distance is greater than three.

5. The microelectronic component arrangement as claimed in claim 1, wherein:
each of the contact elements comprises at least one of solder balls, solder bumps, and solder pillars.

6. The microelectronic component arrangement as claimed in claim 1, wherein:
the mechanically stabilizing material comprises an underfill material.

7. The microelectronic component arrangement as claimed in claim 1, wherein:
the sensor comprises a circuit.

8. The microelectronic component arrangement as claimed in claim 1, wherein:
further solder balls are formed at least regionally on a side of the carrier facing away from the mounting surface.

9. A method for producing a microelectronic component arrangement, comprising:
providing a sensor having a first surface, a second surface opposite the first surface, and at least one side surface, the first surface including at least one detection surface and at least two regions including contact elements that are situated at a first distance with respect to one another, wherein the first distance is between 10 micrometers and 30 micrometers;
providing a carrier comprising a mounting surface;
connecting the sensor to the mounting surface by the contact elements of the at least one region, a second distance being set between the at least one detection surface and the mounting surface,
wherein the first distance less than or equal to the second distance, and
wherein the second distance between 30 micrometers and 100 micrometers; and
stabilizing the connection by a mechanically stabilizing material,
wherein the contact elements are wetted with the mechanically stabilizing material by capillary forces,
wherein the at least two regions are enclosed by the mechanically stabilizing material, and
wherein the detection surface is kept free of the mechanically stabilizing material by the capillary forces.

10. The method as claimed in claim 9, further comprising keeping the mechanically stabilizing material between the contact elements by a surface tension that forms.

11. The method as claimed in claim 9, wherein the first surface comprises an access to the detection surface and the access is kept free of the mechanically stabilizing material by the capillary forces.

12. A microelectronic component arrangement comprising:
a carrier including a mounting surface; and
a sensor including:
a detection surface;
a contact surface that has:
a first material region; and
at least one further material region;
wherein adjacent material regions are spaced apart from each other by a first distance;
a plurality of contact elements that fix the contact surface of the sensor to the mounting surface of the carrier such that the detection surface is opposite the mounting surface at a second distance, the plurality of contact element including:
a first set of at least two contact elements that are distributed over the first material region such that adjacent contact elements are spaced apart by a third distance; and
at least one further set of at least two contact elements that are distributed over the at least one further material region such that adjacent contact elements are spaced apart by the third distance; and
a mechanically stabilizing material that encloses the plurality of contact elements, the third distance sized such that:
(i) adjacent contact elements within each material region are configured to draw the mechanical stabilizing material, in liquid form, into space therebetween via capillary action; and
(ii) a surface tension of the mechanically stabilizing material, in liquid form, prevents the mechanically stabilizing material from filling the first distance between adjacent material regions, the first distance between adjacent material regions forming at least one access to the detection surface between the sensor and the carrier that is free of the mechanically stabilizing material.

13. The microelectronic component arrangement as claimed in claim 12, wherein:
each of the contact elements includes at least one of a solder ball, a solder bump, and a solder pillar.

14. The microelectronic component arrangement as claimed in claim 12, wherein:
the mechanically stabilizing material includes an underfill material.

15. The microelectronic component arrangement as claimed in claim 12, wherein:
the sensor includes a circuit.

16. The microelectronic component arrangement as claimed in claim 1, further comprising a plurality of solder balls positioned, at least regionally on a side of the carrier facing away from the mounting surface.

* * * * *